(12) United States Patent
Hu et al.

(10) Patent No.: US 7,256,446 B2
(45) Date of Patent: Aug. 14, 2007

(54) ONE TIME PROGRAMMABLE MEMORY CELL

(75) Inventors: Yongzhong Hu, Cupertino, CA (US); Sung-Shan Tai, San Jose, CA (US)

(73) Assignee: Alpha and Omega Semiconductor, Ltd., Sunnyvale, CA (US)

( * ) Notice: Subject to any disclaimer, the term of this patent is extended or adjusted under 35 U.S.C. 154(b) by 21 days.

(21) Appl. No.: 11/122,848

(22) Filed: May 5, 2005

(65) Prior Publication Data

US 2006/0249791 A1   Nov. 9, 2006

(51) Int. Cl.
*H01L 29/788* (2006.01)
(52) U.S. Cl. .................. 257/316; 257/321; 438/264; 438/266
(58) Field of Classification Search .............. 257/355, 257/316, 321; 438/264, 266
See application file for complete search history.

(56) References Cited

U.S. PATENT DOCUMENTS 5,331,196 A * 7/1994 Lowrey et al. ............. 257/529

* cited by examiner

*Primary Examiner*—Douglas M. Menz
(74) *Attorney, Agent, or Firm*—Bo-In Lin

(57) ABSTRACT

This invention discloses a one-time programmable (OTP) memory cell. The OTP memory cell includes a dielectric layer disposed between two conductive polysilicon segments wherein the dielectric layer is ready to change from a non-conductive state to a conductive state through an induced voltage breakdown. In a preferred embodiment, one of the conductive polysilicon segments further includes an etch undercut configuration for conveniently inducing the voltage breakdown in the dielectric layer. In a preferred embodiment, the dielectric layer is further formed as sidewalls covering the edges and corners of a first polysilicon segments to conveniently induce a voltage breakdown in the dielectric layer by the edge and corner electrical field effects.

15 Claims, 4 Drawing Sheets

ONE TIME PROGRAMMABLE MEMORY CELL

BACKGROUND OF THE INVENTION

1. Field of the Invention

The invention disclosed herein relates generally to the structure and manufacturing process of a memory cell. More particularly, this invention relates to a novel cell structure and manufacturing process of a write once programmable memory.

2. Description of the Prior Art

In order to reduce cost and to shorten the time-to-market of integrated circuit (IC) products, the design houses are increasingly relying on the readily available foundry processes to carry out the prototyping and manufacturing. However, the device features that are tailored for post-package trimming require additional intellectual property (IP) modules or fuse. These IP modules may include one time programmable (OTP) memory or the electrical erasable programmable read only memory (EEPROM) provided by the foundry with additional costs. In the case of fuse, fuse-trimming using dedicated testing equipment with specific test configuration setup and high current is required. All these extra processing or testing requirements cause delays for shipping the products to the market and also increase the production costs. For these reasons, it is desirable to reduce as much as possible the requirements for post-packaging trimming and testing of these device features.

However, conventional techniques of configuring and designing such OTP memory or EEPROM cell for IC devices require complex processing. In U.S. Pat. No. 4,698,900 a method for making a non-volatile memory with dielectric filled trenches was disclosed. The invention provides a cross point EPROM array that has trenches to provide improved isolation between adjacent buried N+ bit-lines at locations where the adjacent buried N+ bit-lines are not separated by a FAMOS transistor. This results in improved leakage current, improved punch-through voltage characteristics, and in improved programmability for the cell. In another U.S. Pat. No. 6,215,140, Reisinger, et al. disclosed an electrically programmable non-volatile memory cell configuration. The semiconductor substrate is of the first conductivity type. Trenches are aligned to parallel to one another and are incorporated in the semiconductor substrate, and first address lines run along the sidewalls of the trenches. Second address lines are formed on the semiconductor substrate, transversely with respect to the trenches. Semiconductor substrate regions, in which a diode and a dielectric whose conductivity can be changed are arranged, are located between the first address lines and the second address lines. A suitable current pulse can be used to produce a breakdown in the dielectric, with information thus being stored in the dielectric. U.S. Pat. No. 6,584,029 disclosed a one-time programmable memory using fuse/anti-fuse and a vertically oriented fuse unit memory cell. The one-time programmable ("OTP") memory includes one or more memory arrays stacked on top of each other. The OTP memory array is a cross-point array where unit memory cells are formed at the cross-points. The unit memory cell may include a fuse and an anti-fuse in series with each other or may include a vertically oriented fuse. Programming the memory may include the steps of selecting unit memory cells, applying a writing voltage such that critical voltage drop across the selected cells occur. This causes the anti-fuse of the cell to break down to a low resistance. The low resistance of the anti-fuse causes a high current pulse to be delivered to the fuse, which in turn melts the fuse to an open state. Reading the memory may include the steps of selecting unit memory cells for reading, applying a reading voltage to the selected memory cells and measuring whether current is present or not.

The above patented memory cell configurations however does not provide a solution to allow for application of standard foundry processes to enable low-cost post-packaging trimming requirements. Therefore, a need still exists in the art to provide an improved memory configuration and manufacturing methods to provide the one-time programmable memory cells using standard foundry process such that the above discussed difficulties as now encountered in the prior art can be resolved.

SUMMARY OF THE PRESENT INVENTION

It is therefore an object of the present invention to provide a new and improved one-time programmable (OTP) memory cell by using standard IC manufacturing processes commonly implemented in the foundries such that the above discussed difficulties and limitations may be resolved.

Specifically, it is an object of the present invention to provide a one-time programmable (OTP) memory cell by taking advantage of the sidewall and corner breakdown features of a thin oxide layer overlying a polysilicon segment. The phenomena of etch undercut prior to the gate oxidation further degrades the breakdown property of the thin oxide. In general, special attention needs to be paid to avoid the inter-poly oxide low breakdown issues in conventional IC poly-poly capacitors or flash/EEPROM memory interpoly coupling layers (for example, high quality oxide-nitride-oxide composite layers are commonly used). However in this invention disclosure, the weakness of the inter-poly sidewall oxide breakdown is utilized to our advantage as a programming mechanism for the OTP cell. As a breakdown and conductivity between two polysilicon layers can be more conveniently generated, this undesirable poly segment sidewall configuration is implemented for inducing a breakdown and for changing the conductivity state to perform the one-time program function.

Briefly in a preferred embodiment this invention discloses a one-time programmable (OTP) memory cell. The OTP memory cell includes a dielectric layer disposed between two conductive polysilicon segments wherein the dielectric layer is ready to change from a non-conductive state to a conductive state through an induced voltage breakdown. In a preferred embodiment, one of the conductive polysilicon segments further includes an etch undercut configuration for conveniently inducing the voltage breakdown in the dielectric layer. In another preferred embodiment, one of the conductive polysilicon segments further includes an etch undercut configuration for conveniently inducing the voltage breakdown in the dielectric layer via a corner electrical field effect. In another preferred embodiment, the dielectric layer constituting a sidewall covering one of the conductive polysilicon segments with an etch undercut configuration for inducing the voltage breakdown in the dielectric layer via an edge electrical field effect. In another preferred embodiment, one of the conductive polysilicon segments further includes a corner for conveniently inducing the voltage breakdown in the dielectric layer via a corner electrical field effect. In another preferred embodiment, the OTP memory cell further includes a semiconductor substrate having an insulating layer disposed on a top surface of the substrate for supporting the OTP memory cell thereon. In another preferred embodiment, the OTP memory cell further includes an insulating passivation layer covering the OTP memory cell and the insulating passivation layer further includes contact opening for depositing electrode metal therein to for electrically contacting the conductive polysilicon segments to function as electrodes. In another preferred embodiment, the conductive polysilicon segments are conductive impurity doped polysilicon segments. The conductive polysilicon segments can be a P-type impurity doped or N-type impurity doped polysilicon segment.

This invention further discloses a method for manufacturing a one-time programmable (OTP) memory cell. The method includes a step of disposing a dielectric layer between two conductive polysilicon segments for readily inducing a voltage breakdown in the dielectric to change from a non-conductive state to a conductive state for carrying out a one-time program operation. In another preferred embodiment, the method further includes a step of forming one of the conductive polysilicon segments with an etch undercut configuration for conveniently inducing the voltage breakdown in the dielectric layer. In another preferred embodiment, the method further includes a step of forming one of the conductive polysilicon segments with an etch undercut configuration with a corner for conveniently inducing the voltage breakdown in the dielectric layer via a corner electrical field effect. In another preferred embodiment, the method further includes a step of forming one of the dielectric layer as a sidewall covering one of the conductive polysilicon segments with an etch undercut configuration for inducing the voltage breakdown in the dielectric layer via an edge electrical field effect. In another preferred embodiment, the method further includes a step of forming one of the conductive polysilicon segments with a corner for conveniently inducing the voltage breakdown in the dielectric layer via a corner electrical field effect.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1:
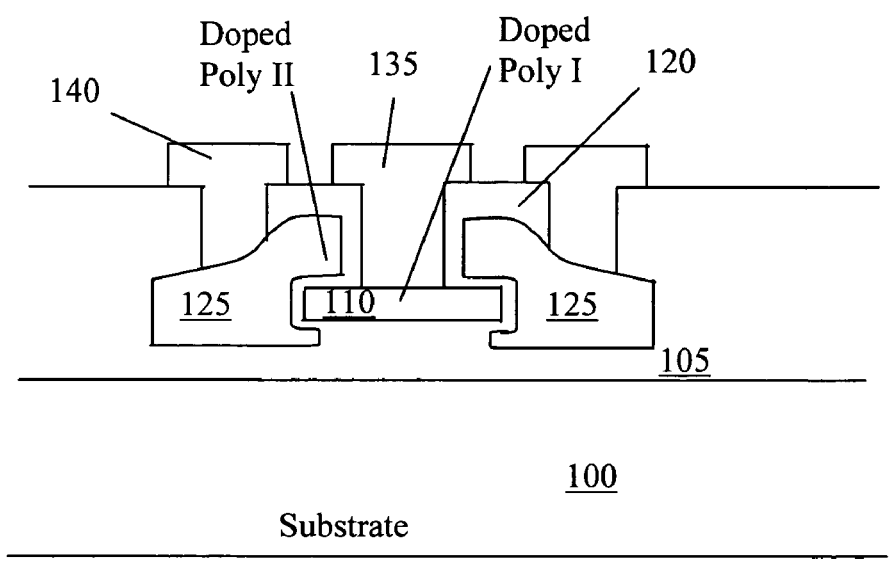
FIG. 1 is a side cross sectional view of a one-time programmable memory cell of this invention.

Referring to FIG. 1 for a one-time programmable memory cell of this invention supported on a thick field oxide layer 100 formed on a top surface of a semiconductor substrate 100. The thick field oxide layer 105 insulates the cell from the substrate 100. A first doped poly region 210 is insulted with a thin layer low voltage gate oxide 120 from a second doped polysilicon region 125. Each poly region has an electrode, e.g., electrodes 135 and 140 respectively, connected for data recording and reading. The thin gate oxide layer 120 between the two doped poly regions blocks the conductivity between the two doped poly regions 110 and 125. However, the conducting status between the two doped poly regions 110 and 125 may be changed for the purpose of programming the memory. In the process of programming the memory cell as shown in FIG. 1, a high voltage may be applied to the electrodes between doped poly regions 110 and 125. When the voltage is high enough, a breakdown is induced in the single crystal thin gate oxide layer 120 and becomes conductive. The high voltage therefore changes the conductance between the two doped poly regions 110 and 125 and is employed to store a binary bit in the cell. The threshold voltage is related to the thickness as well as the micro microstructure of the oxide layer 120.

The key features as that shown in FIG. 1 are the relative positions of the second polysilicon poly-2 segment 125 over the first polysilicon poly-1 segment. The sidewall overlaying the poly-1 segment 110 includes a corner undercut. With the undercut and edge effects of the thin oxide layer 120 as sidewall covering the poly-1 segment 110, a breakdown can be conveniently induced and the state of conductivity can be more easily changed for writing a binary bit into the memory cell by applying a high voltage over the electrodes 135 and 140.

Figure 2A:
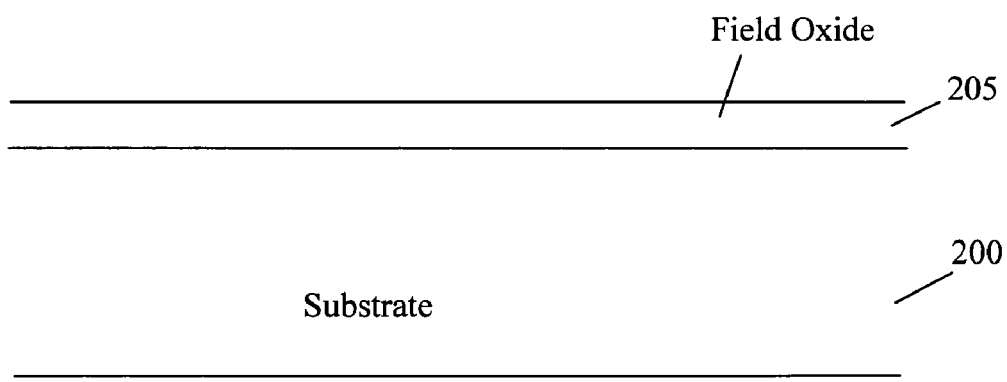
FIGS. 2A to 2G are a serial of side cross sectional views for illustrating the processing steps for manufacturing the OTP memory cell of FIG. 1.
Figure 2B:
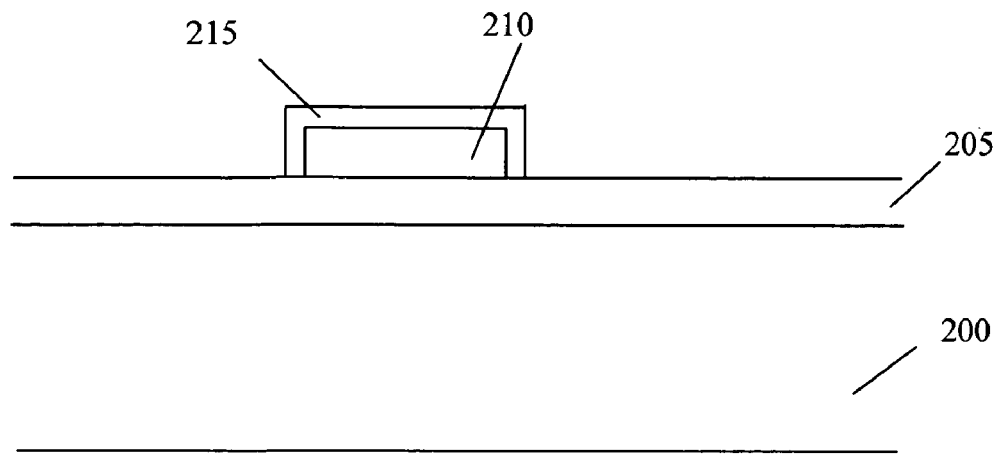

Referring to FIGS. 2A to 2F for a serial of side cross sectional views for the illustration of the processing steps to fabricate the one-time programmable memory cell of FIG. 1. In FIG. 2A, a field oxide layer 205 of approximately three to eight Angstrom thickness is formed on top of a semiconductor substrate 200 by using a thermal oxidation process. In FIG. 2B, a polysilicon layer 210 of approximately 500 to 2000 Angstroms in layer thickness is deposited on top of the field oxide layer 205. A N-type or P-type ion implant with an ion flux intensity of approximately $1\times10^{14}$ to $1\times10^{15}$/cm2 is then carried out over the polysilicon layer 210 to make the poly-1 more conductive. A mask is then applied to etch and pattern the polysilicon layer 210 to form a poly-1 segment 210 as shown. A high voltage oxide layer 215 is grown over the poly-1 segment.

Figure 2C:
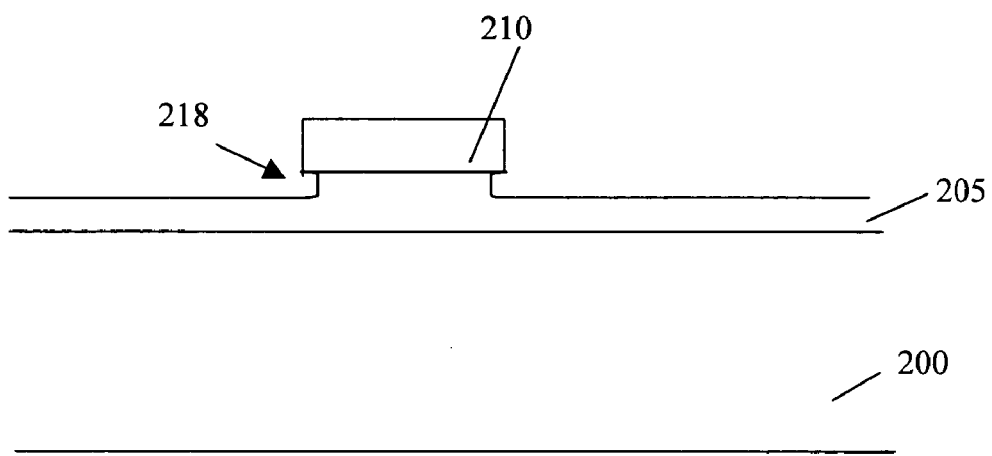
Figure 2D:
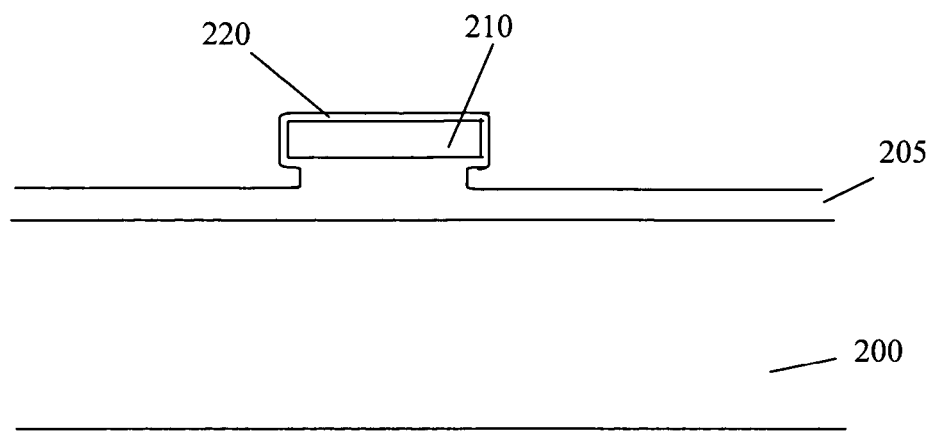
Figure 2E:
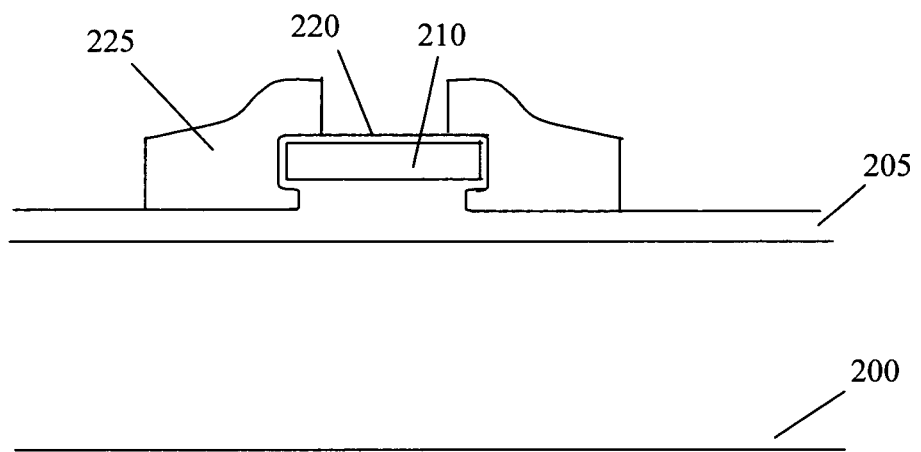
Figure 2F:
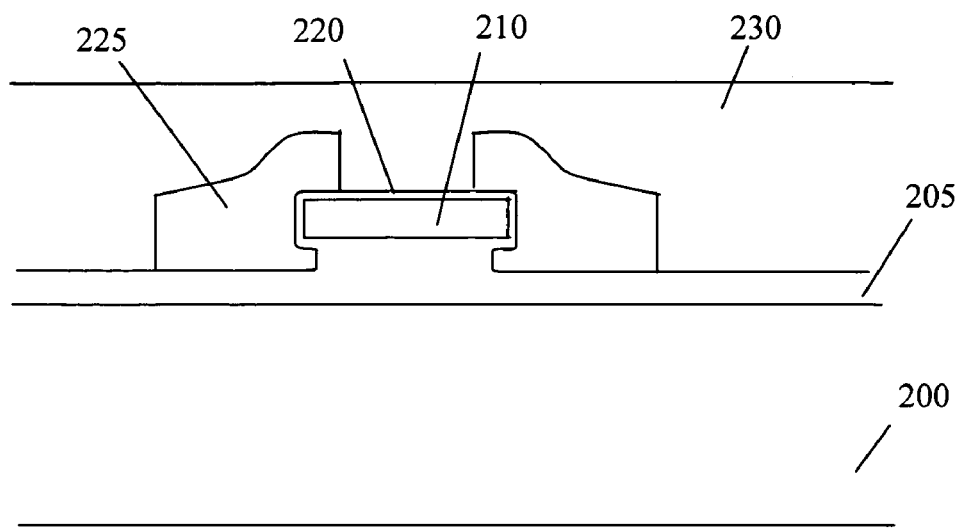
Figure 2G:
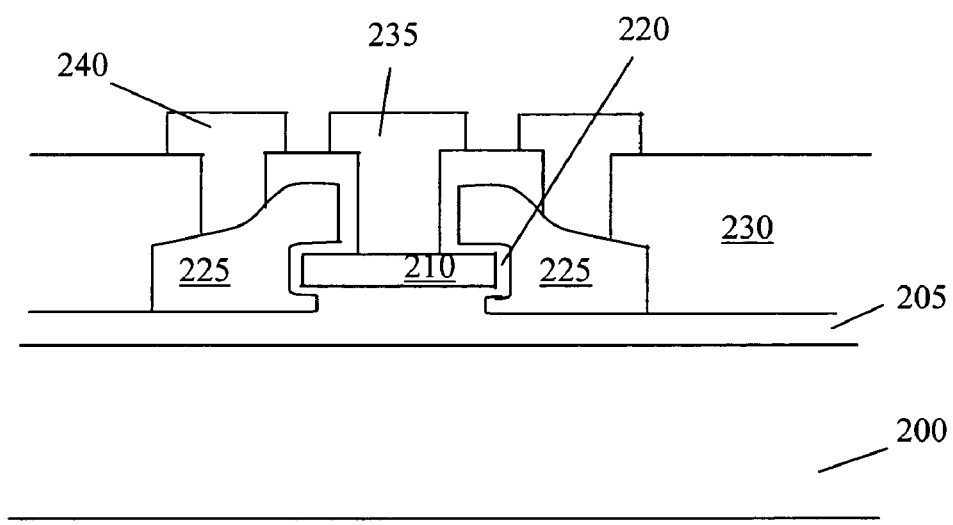

In FIG. 2C, the high voltage oxide layer 215 is etched off in the active cell area and maintaining the high voltage oxide layer in the peripheral region to support the high voltage recording operation. The etch process produces an undercut 218 below the edge of the poly-1 segment 210. In FIG. 2D, a thin layer of low voltage oxide 220 of approximately 120 Angstroms in thickness is grown over the poly-1 segment 210. In FIG. 2E, a second polysilicon layer 225 is deposited. An ion implant is carried out on the second polysilicon layer 225 with a similar dopant concentration with either a N-type or P-type ions. Then a mask is applied to etch and pattern the second polysilicon layer 225 as that shown in FIG. 2E. In FIG. 2F, an oxide or BPSG layer 230 is deposited over the top to cover the entire top surface. Then in FIG. 2G, a contact mask is applied to open contact holes in the BPSG layer 230 and the metal contact is then deposited into the contact openings to form the electrodes 235 and 240 for establishing electric contacts to the doped poly-1 and poly 2 layers 210 and 225 respectively.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A one-time programmable (OTP) memory cell comprising:
   a dielectric layer disposed immediately between a first and a second conductive polysilicon segments functioning as a high voltage electrode and a low voltage electrode for applying a high and a low voltage thereon respectively wherein said dielectric layer wrapping around a bottom edge of said first conductive segment constituting a breakdown vulnerable layer immediately near said bottom edge and is ready to change from a non-conductive state to a conductive state through an induced voltage breakdown.

2. The one-time programmable (OTP) memory cell of claim 1 wherein:

said second conductive polysilicon segments further extends into an etch undercut space below said first conductive polysilicon segment underneath said dielectric layer wrapping around said bottom edge of said first polysilicon conductive segment for conveniently inducing said voltage breakdown in said dielectric layer.

3. The one-time programmable (OTP) memory cell of claim 1 wherein:

said dielectric layer wrapping around said bottom edge of said first conductive polysilicon segment further wrapping around a bottom corner of said first conductive polysilicon segment.

4. The one-time programmable (OTP) memory cell of claim 1 wherein:

said dielectric layer further wrapping around a top edge of said first conductive polysilicon segment with said second conductive polysilicon segment disposed above said dielectric layer.

5. The one-time programmable (OTP) memory cell of claim 4 wherein:

said dielectric layer wrapping around said top edge of said first conductive polysilicon segment further wrapping around a top corner of said first conductive polysilicon segment.

6. The one-time programmable (OTP) memory cell of claim 1 further comprising:

a semiconductor substrate having an insulating layer disposed below said first and second conductive polysilicon segments wherein said insulation layer having an undercut space below said first conductive polysilicon segment to allow said second conductive polysilicon segment to fill therein.

7. The one-time programmable (OTP) memory cell of claim 1 further comprising:

an insulating passivation layer covering said OTP memory cell and said insulating passivation layer further includes contact opening for depositing electrode metal therein to for electrically contacting said first and second conductive polysilicon segments functioning as electrodes.

8. The one-time programmable (OTP) memory cell of claim 1 wherein:

said first and second conductive polysilicon segments comprising a first and second conductive impurity doped polysilicon segments.

9. The one-time programmable (OTP) memory cell of claim 1 wherein:

at least one of said first and second conductive polysilicon segments comprising a N-type impurity doped polysilicon segment.

10. The one-time programmable (OTP) memory cell of claim 1 wherein:

at least one of said first and second conductive polysilicon segments comprising a P-type impurity doped polysilicon segment.

11. A method for manufacturing a one-time programmable (OTP) memory cell comprising:

disposing a dielectric layer immediately between a first and a second conductive polysilicon segments with said dielectric layer wrapping around a bottom edge of said first conductive polysilicon segment for functioning as a breakdown vulnerable layer for readily inducing a voltage breakdown in said dielectric layer to change from a non-conductive state to a conductive state for carrying out a one-time program operation.

12. A method of manufacturing a one-time programmable (OTP) memory cell comprising:

forming a first conductive polysilicon segment on to of an insulation layer supported on a semiconductor substrate and growing an oxide layer around said first conductive polysilicon segment followed by etching off said oxide layer from around said first conductive polysilicon layer with an etch undercut extending to a space underneath said first conductive polysilicon segment; and depositing a conformal dielectric layer around said first conductive polysilicon segment wrapping around a bottom edge of said first conductively polysilicon segment thus forming a breakdown vulnerable layer near said bottom edge for conveniently inducing a voltage breakdown in said dielectric layer.

13. The method of claim 12 further comprising:

forming a second conductive polysilicon segment overlying said conformal dielectric layer for functioning with said first conductive polysilicon segment as electrodes for applying a high and a low voltages thereon to induce said breakdown in said dielectric layer.

14. The method of claim 12 wherein:

said step of forming said conformal dielectric layer further comprising forming said conformal dielectric layer around said first conductive polysilicon segment wrapping around a top edge of said first conductively polysilicon segment.

15. The method of claim 12 further comprising:

forming a second conductive polysilicon segment overlying said conformal dielectric layer with a bottom portion of said second conductive polysilicon segment extending into said etch undercut space underneath said first conductive polysilicon segment for functioning with said first conductive polysilicon segment as electrodes for applying a high and a low voltages thereon to induce said breakdown in said dielectric layer.

* * * * *